(12) United States Patent
Sasaki

(10) Patent No.: US 7,027,473 B2
(45) Date of Patent: Apr. 11, 2006

(54) MULTIMODE SEMICONDUCTOR LASER MODULE, WAVELENGTH DETECTOR, WAVELENGTH STABILIZER, AND RAMAN AMPLIFIER

(75) Inventor: Goro Sasaki, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/260,303

(22) Filed: Oct. 1, 2002

(65) Prior Publication Data

US 2003/0063636 A1 Apr. 3, 2003

(30) Foreign Application Priority Data

Oct. 1, 2001 (JP) ............................ P2001-305741

(51) Int. Cl.
*H01S 3/13* (2006.01)
(52) U.S. Cl. .................................. 372/32; 372/29.011
(58) Field of Classification Search .................... 372/6, 372/18, 32, 36, 20, 92, 96, 29, 26, 9, 33, 372/23, 28; 385/12, 15; 359/249, 110, 132, 359/127
See application file for complete search history.

(56) References Cited

U.S. PATENT DOCUMENTS

| | | | | |
|---|---|---|---|---|
| 4,842,358 A | * | 6/1989 | Hall | 385/12 |
| 5,054,028 A | * | 10/1991 | Esherick et al. | 372/32 |
| 5,068,865 A | * | 11/1991 | Ohshima et al. | 372/36 |
| 5,119,229 A | * | 6/1992 | Grasso et al. | 359/341.1 |
| 5,167,444 A | * | 12/1992 | Hall | 385/15 |
| 5,272,560 A | * | 12/1993 | Baney et al. | 359/249 |
| 5,361,161 A | * | 11/1994 | Baney et al. | 359/337 |
| 5,448,390 A | * | 9/1995 | Tsuchiya et al. | 398/42 |
| 5,717,804 A | * | 2/1998 | Pan et al. | 385/94 |
| 5,784,506 A | * | 7/1998 | Pfeiffer | 385/24 |
| 5,825,792 A | * | 10/1998 | Villeneuve et al. | 372/32 |
| 5,867,513 A | * | 2/1999 | Sato | 372/32 |

(Continued)

FOREIGN PATENT DOCUMENTS

EP  0 883 216  12/1998

(Continued)

OTHER PUBLICATIONS

Kazuo Sakai, et al., "1.5 μm Range InGaAsP/InP Distributed Feedback Lasers", IEEE Journal of Quantum Electronics, vol. QE-18, No. 8, Aug. 1982, pp. 1272-1278.

(Continued)

*Primary Examiner*—Tuyet Vo
*Assistant Examiner*—Hung Tran Vy
(74) *Attorney, Agent, or Firm*—Smith, Gambrell & Russell LLP

(57) ABSTRACT

The present invention provides a multimode semiconductor laser module. The module comprises a multimode laser element 34, an optical filter 54, a light-receiving element 52 and a temperature regulator 24. Multimode light from the laser element 34 is transmitted through the filter 54 and then detected by the light-receiving element 52. The output of the light-receiving element 52 changes according to the degree of overlap between the oscillation wavelength spectrum of the laser element 34 and the transmission wavelength region of the filter 54. The temperature regulator 24 modifies the oscillation wavelength region toward the desired region in response to the output of the light-receiving element 52. As a result, the oscillation wavelength region is stabilized.

18 Claims, 14 Drawing Sheets

U.S. PATENT DOCUMENTS

| | | | | |
|---|---|---|---|---|
| 5,917,596 | A | * | 6/1999 | Jenkins et al. ............... 356/491 |
| 6,122,301 | A | * | 9/2000 | Tei et al. ...................... 372/32 |
| 6,144,025 | A | | 11/2000 | Tei et al. |
| 6,215,573 | B1 | * | 4/2001 | Pfeiffer ....................... 398/212 |
| 6,233,263 | B1 | * | 5/2001 | Chang-Hasnain et al. .... 372/32 |
| 6,292,288 | B1 | | 9/2001 | Akasaka et al. |
| 6,384,963 | B1 | * | 5/2002 | Ackerman et al. .......... 359/334 |
| 6,404,528 | B1 | * | 6/2002 | Pfeiffer ....................... 398/202 |
| 6,476,916 | B1 | * | 11/2002 | Lacot et al. ................. 356/445 |
| 6,477,191 | B1 | * | 11/2002 | Okada et al. ................. 372/46 |
| 6,526,079 | B1 | * | 2/2003 | Watterson et al. ............ 372/32 |
| 6,611,546 | B1 | * | 8/2003 | Garnache et al. ............. 372/92 |
| 6,741,629 | B1 | * | 5/2004 | Garnache et al. ............. 372/96 |
| 2001/0046083 | A1 | | 11/2001 | Akasaka et al. |
| 2001/0050802 | A1 | | 12/2001 | Namiki et al. |
| 2002/0011831 | A1 | * | 1/2002 | Minier ......................... 324/96 |
| 2002/0021487 | A1 | | 2/2002 | Akasaka et al. |
| 2002/0085267 | A1 | | 7/2002 | Akasaka et al. |
| 2002/0118715 | A1 | * | 8/2002 | Kimura et al. ................ 372/36 |
| 2002/0181833 | A1 | * | 12/2002 | Berger ......................... 385/15 |
| 2003/0053199 | A1 | | 3/2003 | Akasaka et al. |
| 2003/0058524 | A1 | | 3/2003 | Akasaka et al. |
| 2004/0032641 | A1 | | 2/2004 | Namiki et al. |
| 2004/0190909 | A1 | | 9/2004 | Akasaka et al. |

FOREIGN PATENT DOCUMENTS

| | | |
|---|---|---|
| EP | 0 926 789 | 6/1999 |
| EP | 1 018 666 | 7/2000 |
| EP | 1 063 794 | 12/2000 |
| JP | 2914748 | 4/1999 |

OTHER PUBLICATIONS

Daniel Hofsteter, et al., "Electrically injected InGaN/GaN-based DFB laser", Xerox Research Center (May 13, 1998).

Patent Abstract of Japan, Publication No. 2000056185, Publication Date: Feb. 25, 2000, vol. 2000, No. 5.

Patent Abstract of Japan, Publication No. 11047289, Publication Date: Feb. 23, 1999, vol. 1999, No. 5.

Patent Abstract of Japan, Publication No. 09219554, Publication Date: Aug. 19, 1997, vol. 1997, No. 12.

Patent Abstract of Japan, Publication No. 2000332332, Publication Date: Nov. 30, 2000, vol. 2000, No. 14.

Patent Abstract of Japan, Publication No. 08204275, Publication Date: Aug. 9, 1996, vol. 1996, No. 12.

Patent Abstract of Japan, Publication No. 59029219, Publication Date: Feb. 16, 1984, vol. 008, No. 125.

* cited by examiner

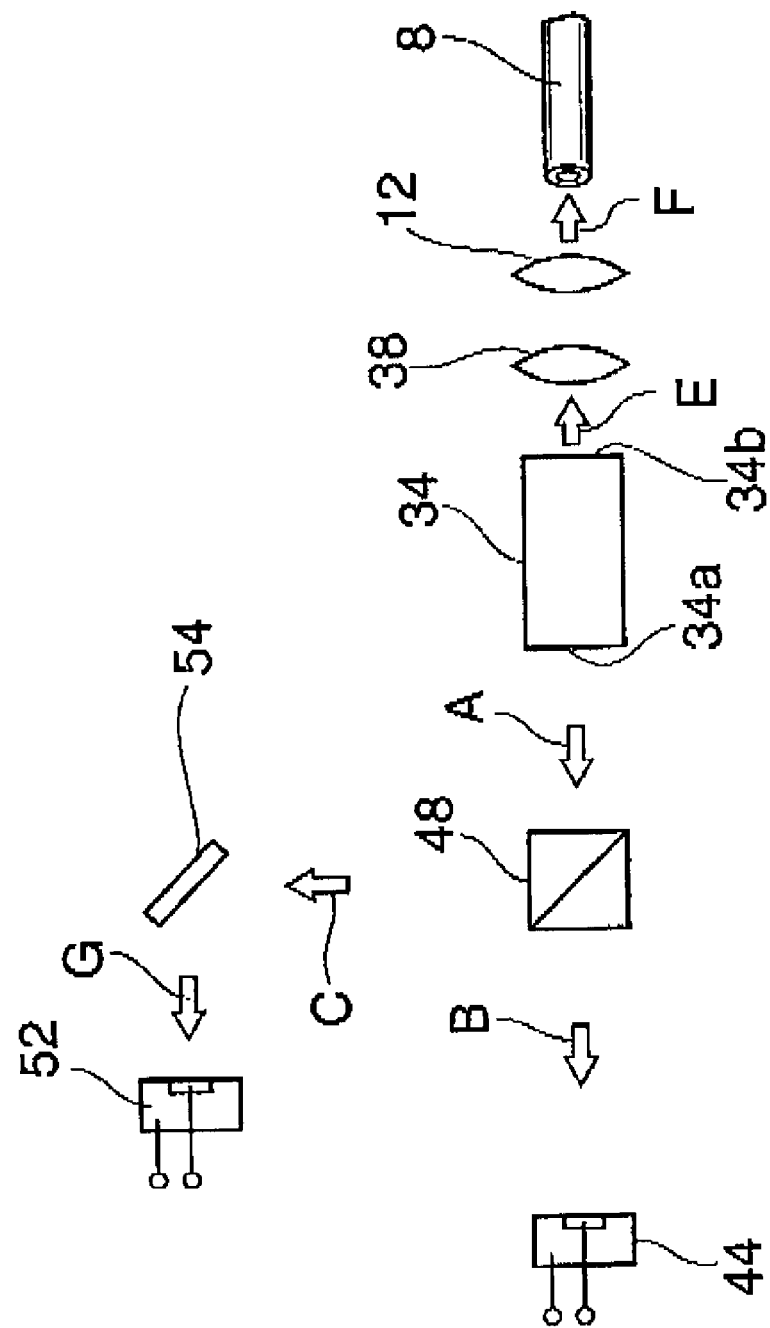

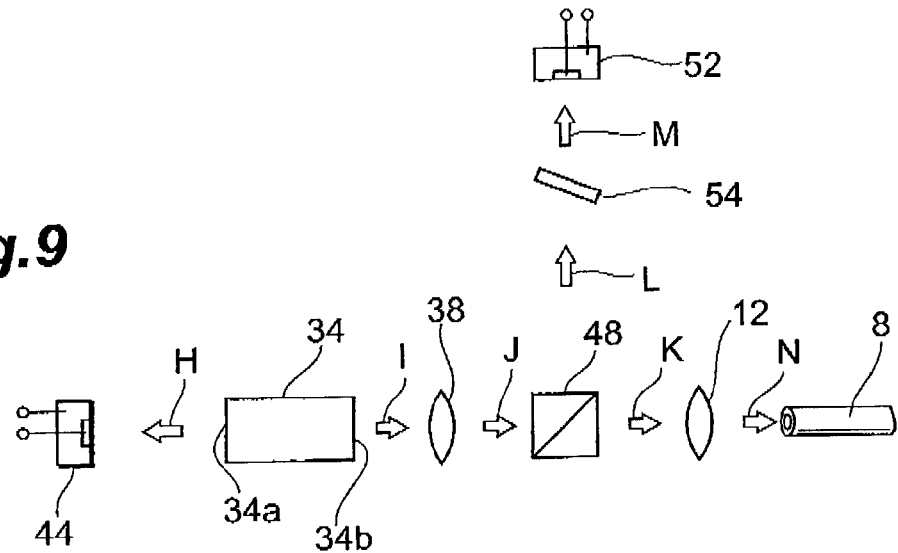
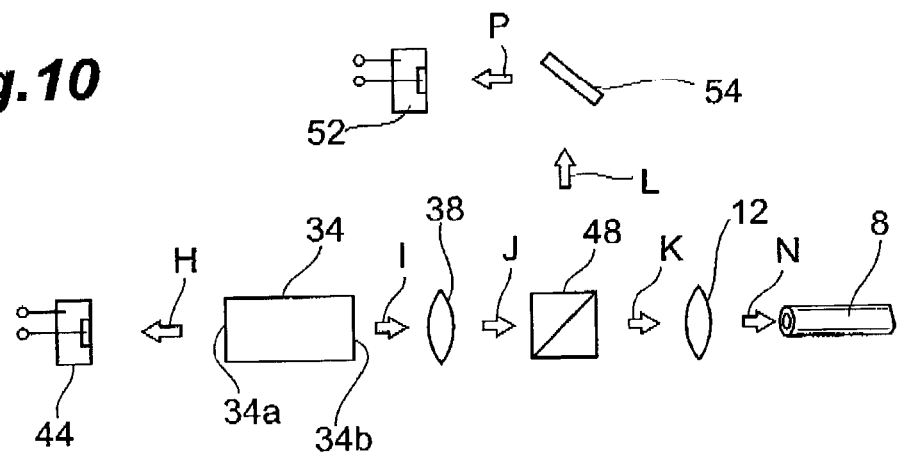

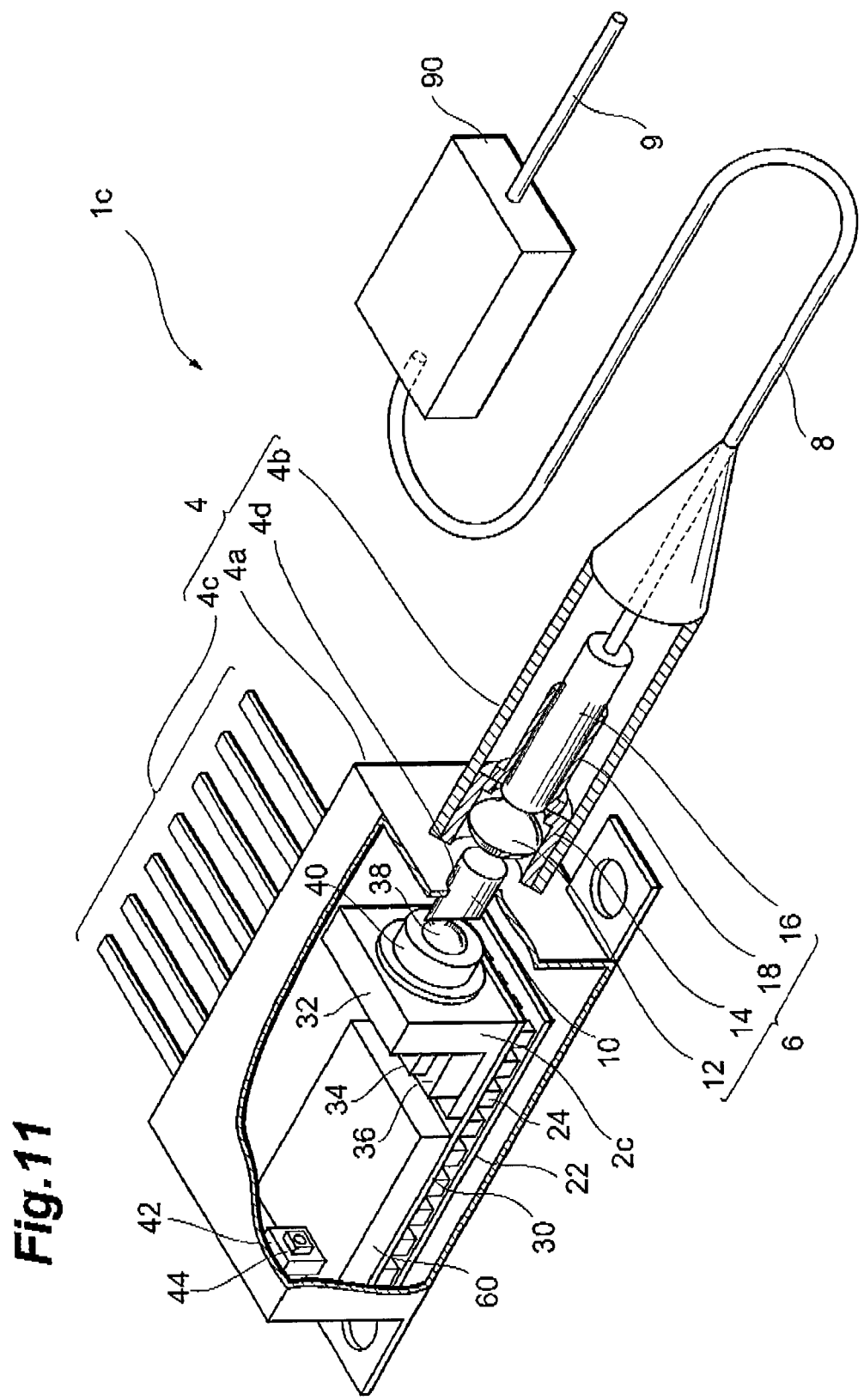

MULTIMODE SEMICONDUCTOR LASER MODULE, WAVELENGTH DETECTOR, WAVELENGTH STABILIZER, AND RAMAN AMPLIFIER

BACKGROUND OF THE INVENTION

1. Field of the Invention

The present invention relates to a multimode semiconductor laser module, a wavelength detector, a wavelength stabilizer, and a Raman amplifier.

2. Related Background Art

There are semiconductor laser modules (abbreviated as LD modules hereinbelow) of two types: a single-mode LD module generating a single-mode laser beam and a multimode LD module generating a multimode laser beam.

A single-mode LD module is used, for example, to generate signal light in a Wavelength Division Multiplexing (WDM) communication system. In WDM communication, signal light with a narrow line width is required. For this reason, the output wavelength of a single-mode LD module has to be controlled to an order of 10 pm. An optical element called etalon, which utilizes optical interference, is used to satisfy this requirement.

Wavelength stabilization of a single-mode laser using an etalon is disclosed in Japanese Patent No. 2914748, U.S. Pat. No. 5,825,792, and European Patents Nos. EP 0 926 789 A2 and EP 0 883 216 A2. A single-mode laser beam is introduced into an etalon from a LD module. Even slight change in the wavelength of the laser beam greatly changes the intensity of light emitted from the etalon due to interference of the incident light into the etalon. Detecting the change in the light intensity using a photodiode allows slight change in the output wavelength of the LD module to be detected. The output wavelength of the LD module is controlled according to the output of the photodiode. Stabilization of the output wavelength is attempted in this way.

SUMMARY OF THE INVENTION

It is an object of the present invention to stabilize the wavelength of a multimode laser beam.

The inventor has studied wavelength stabilization of a multimode LD module rather that a single-mode LD module. The inventor has investigated the usage of an etalon for stabilizing the output wavelength of a multimode LD module. Based on the results obtained, the inventor found out that the interference is eliminated when multimode light is introduced into the etalon. Therefore, the output wavelength cannot be stabilized even when the etalon is used in the multimode LD module. As for a single-mode LD module, even slight change in the laser beam wavelength can be detected using an etalon because a single-mode laser beam with good monochromaticity can be provided for the etalon. However, a different solution is required for wavelength stabilization in a multimode LD module.

The present invention provides a multimode semiconductor laser module. The laser module comprises a multimode semiconductor laser element, an optical filter, a first light-receiving element, and wavelength modifying means. The laser element has first and second end surfaces for emitting multimode laser light. The optical filter is optically coupled with the first surface to receive the multimode laser light emitted from the first surface. The first light-receiving element receives transmitted light or reflected light from the filter to generate an output signal corresponding to the power of the received light. The wavelength modifying means modifies an oscillation wavelength region of the laser element in response to the output signal of the first light-receiving element.

A multimode laser element, by contrast with a single-mode laser element, produces laser light over a relatively wide wavelength region. An optical filter transmits or reflects light over a certain wavelength region. Therefore, if the multimode light from the laser element enters the filter, the transmitted light from the filter will have a power corresponding to the degree of overlap between the oscillation wavelength region of the laser element and the transmission wavelength region of the filter. Also, the reflected light from the filter will have a power corresponding to the degree of overlap between the oscillation wavelength region of the laser element and the reflection wavelength region of the filter. Since the first light-receiving element receives the transmitted or reflected light from the filter, it generates an output signal reflecting change in the oscillation wavelength region of the laser element. Consequently, controlling the wavelength modifying means based on this output signal so that the oscillation wavelength region of the laser element approaches a desired region enables the oscillation wavelength region to be stabilized at the desired region.

The laser module may further comprise a light splitting device and a second light-receiving element. The light splitting device receives the multimode laser light from the first end surface of the laser element to produce two split beams. The second light-receiving element receives one of the split beams from the light splitting device. The optical filter receives the other split beam from the light splitting device. The light splitting device may regulate the ratio between the powers of the split beams provided to the optical filter and the second light-receiving element.

Another aspect of the invention provides a wavelength detector. The wavelength detector comprises a light input port, an optical filter, a light-receiving element, and a light output port. The light input port is used for receiving multimode laser light from a multimode semiconductor laser element. The optical filter is optically coupled with the input port to receive the multimode laser light from the input port. The light-receiving element receives one of transmitted light and reflected light from the optical filter to generate an output signal corresponding to the power of the received light. The light output port receives the other of the transmitted light and reflected light from the optical filter.

Since the light-receiving element receives the multimode light through the optical filter, it generates the output signal reflecting change in the oscillation wavelength region of the laser element. Therefore, modifying the oscillation wavelength region of the laser element based on the output signal toward a desired region enables the oscillation wavelength region to be stabilized at the desired region.

Yet another aspect of the invention provides a multimode semiconductor laser module. The laser module comprises a multimode semiconductor laser element, a light input port, an optical filter, a first light-receiving element, a light output port, and wavelength modifying means. The light input port receives multimode laser light from the laser element. The optical filter is optically coupled with the input port to receive the multimode laser light from the input port. The first light-receiving element receives one of transmitted light and reflected light from the optical filter to generate an output signal corresponding to the power of the received light. The light output port receives the other of the transmitted light and reflected light from the optical filter. The wavelength modifying means modifies the oscillation wavelength region of the laser element according to the output signal of the first light-receiving element.

Since the first light-receiving element receives the multimode light through the optical filter, it generates an output signal reflecting change in the oscillation wavelength region of the laser element. Therefore, controlling the wavelength modifying means based on the output signal so that the oscillation wavelength region of the laser element approaches a desired region enables the oscillation wavelength region to be stabilized at the desired region.

Another aspect of the invention provides a wavelength stabilizer. The wavelength stabilizer comprises a laser module in accordance with the present invention, and a control circuit. The control circuit generates a control signal in response to the output signal of the first light-receiving element to control the wavelength modifying means. The wavelength modifying means modifies the oscillation wavelength region of the laser element according to the control signal.

Since the first light-receiving element receives the multimode light through the optical filter, it generates an output signal reflecting change in the oscillation wavelength region of the laser element. When the control circuit controls the wavelength modifying means in response to this output signal to modify the oscillation wavelength region of the laser element toward a desired region, the oscillation wavelength region can be stabilized at the desired region.

Still another aspect of the invention provides a Raman amplifier. The Raman amplifier comprises an optical coupler, an optical transmission path for transmitting signal light, a laser module in accordance with the present invention, and a control circuit. Both the optical transmission path and the laser module are optically coupled with the optical coupler. The control circuit generates a control signal in response to the output signal of the first light-receiving element to control the wavelength modifying means. The wavelength modifying means modifies the oscillation wavelength region of the laser element according to the control signal. The optical coupler sends multimode light from the laser module to the optical transmission path. As a result, the multimode light excites the optical transmission path to Raman-amplify the signal light. Since the control circuit stabilizes the wavelength region of the multimode light from the laser module, the Raman amplifier performs Raman amplification reliably.

The optical filter may produce transmitted light or reflected light with a power which changes according to the oscillation wavelength region of the laser element. The optical filter may have a transmission wavelength region or reflection wavelength region which can include two or more diodes of the laser element. The optical filter may be a long-wavelength-pass filter, a short-wavelength-pass filter or a band-pass filter. The optical filter may be a dielectric multilayer film filter.

The laser module in accordance with the present invention may have a first terminal for supplying the output signal of the first light-receiving element to an external control circuit and a second terminal for supplying a signal from the external control circuit to the wavelength modifying means. The external control circuit generates a control signal in response to the output signal of the first light-receiving element. This control signal instructs the wavelength modifying means to modify the oscillation wavelength region of the laser element so that the oscillation wavelength spectrum of the laser element has a desired central wavelength. The wavelength modifying means modifies the oscillation wavelength region of the laser element according to the control signal.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 7 is a Schematic view illustrating the arrangement of the components in a laser module in accordance with a second embodiment;

FIG. 9 is a schematic view illustrating the arrangement of the components in the laser module of the third embodiment;

FIG. 10 is a schematic view illustrating the arrangement of the components in a laser module in accordance with a fourth embodiment;

FIG. 11 is a partially cutaway perspective view illustrating the structure of a laser module in accordance with a fifth embodiment;

DESCRIPTION OF THE PREFERRED EMBODIMENTS

Figure 1:
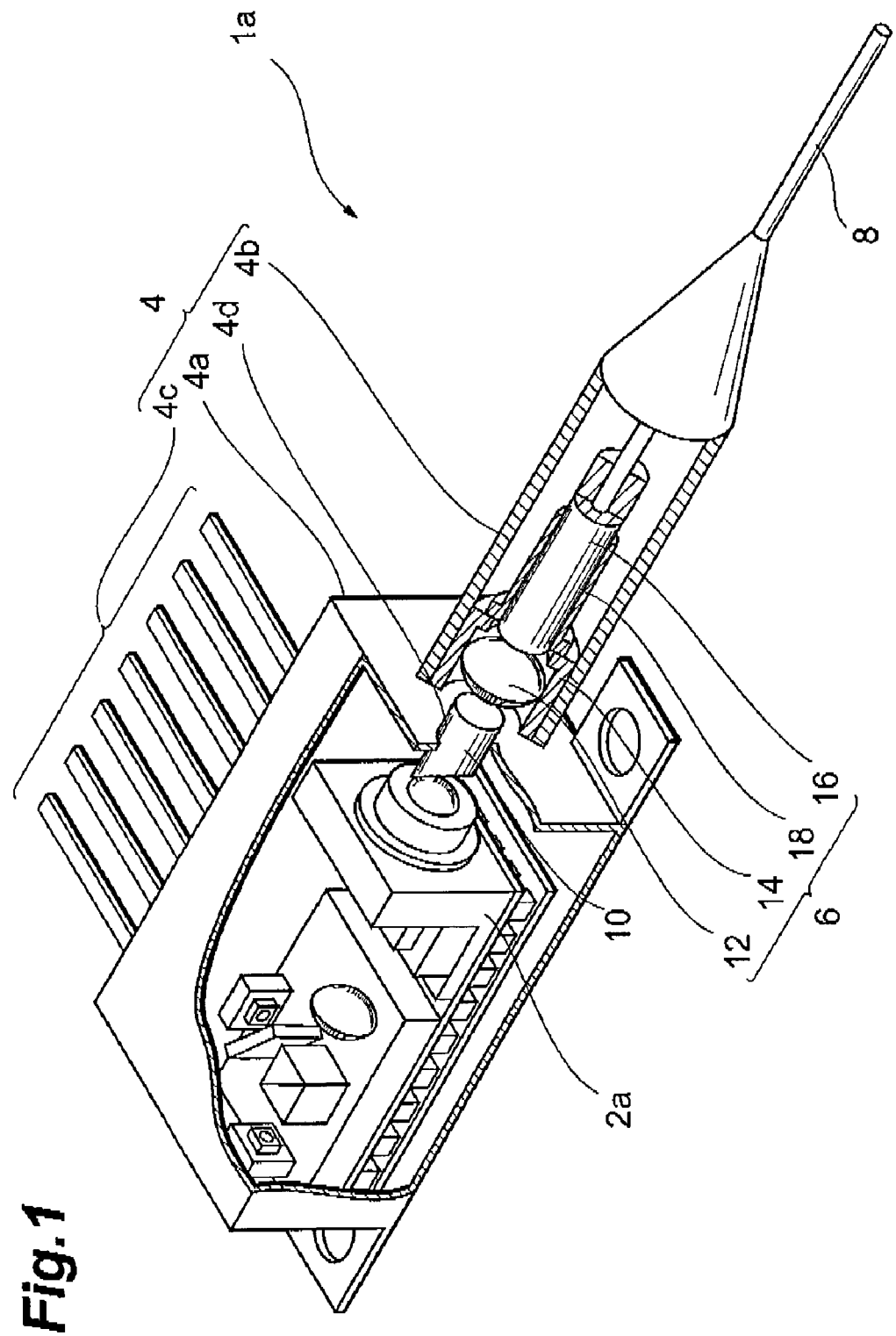
FIG. 1 is a partially cutaway perspective view illustrating the structure of a laser module in accordance with a first embodiment.

The preferred embodiments of the present invention will be described below in greater detail with reference to the accompanying drawings. To facilitate understanding, identical reference numerals have been used, where possible, to designate identical or equivalent elements that are common to the figures without repeating the overlapping descriptions.

First Embodiment

FIG. 1 is a partially cutaway perspective view illustrating the structure of a multimode semiconductor laser module 1a of this embodiment. The semiconductor laser module will be referred to as a LD module hereinbelow. The LD module 1a comprises a main part 2a, a housing 4, an optical coupling part 6, and an optical fiber 8.

The main part 2a provides multimode laser light whose wavelength is stabilized with some accuracy. The structure of the main part 2a will be described below in greater detail.

The housing 4 comprises an accommodation part 4a, an optical fiber supporting part 4b, a lead terminal 4c, and a light passing aperture 4d. The accommodation part 4a determines an arrangement space for accommodating the main part 2a. The optical fiber supporting part 4b is provided on the front wall of the accommodation part 4a. The fiber supporting part 4b holds the optical fiber 8 so that the optical fiber 8 is optically coupled with the main part 2a. The lead terminals 4c are provided on the side wall of the accommodation part 4a. The lead terminals 4c are electrically connected to the main part 2a. The light passing aperture 4a is provided in the front wall of accommodation part 4a. Light directed from the main part 2a to the fiber supporting part 4b passes through the light passing aperture 4d. A hermetic glass 10 is disposed in the light passing aperture 4d, and thereby the arrangement space is air-tightly sealed. The housing 4 of this embodiment is a butterfly-type package; however, the housing 4 may be a package of a different type.

The optical coupling part 6 comprises a lens 12, a lens holder 14, a ferrule 16, and a ferrule holder 18. The coupling part 6 is disposed in the fiber supporting part 4b. The fiber supporting part 4b accommodates the lens holder 14 so as to cover the outer surface of the lens holder 14, The ferrule holder 18 is mounted on the lens holder 14. The ferrule holder 18 accommodates the ferrule 16. The ferrule 16 holds the optical fiber 8. The lens holder 14 holds the lens 12 inside. The lens 12 is disposed so as to optically couple the main part 2a to one end of the optical fiber 8. With such a configuration, light from main part 2a is supplied to the optical fiber 8.

Figure 2:
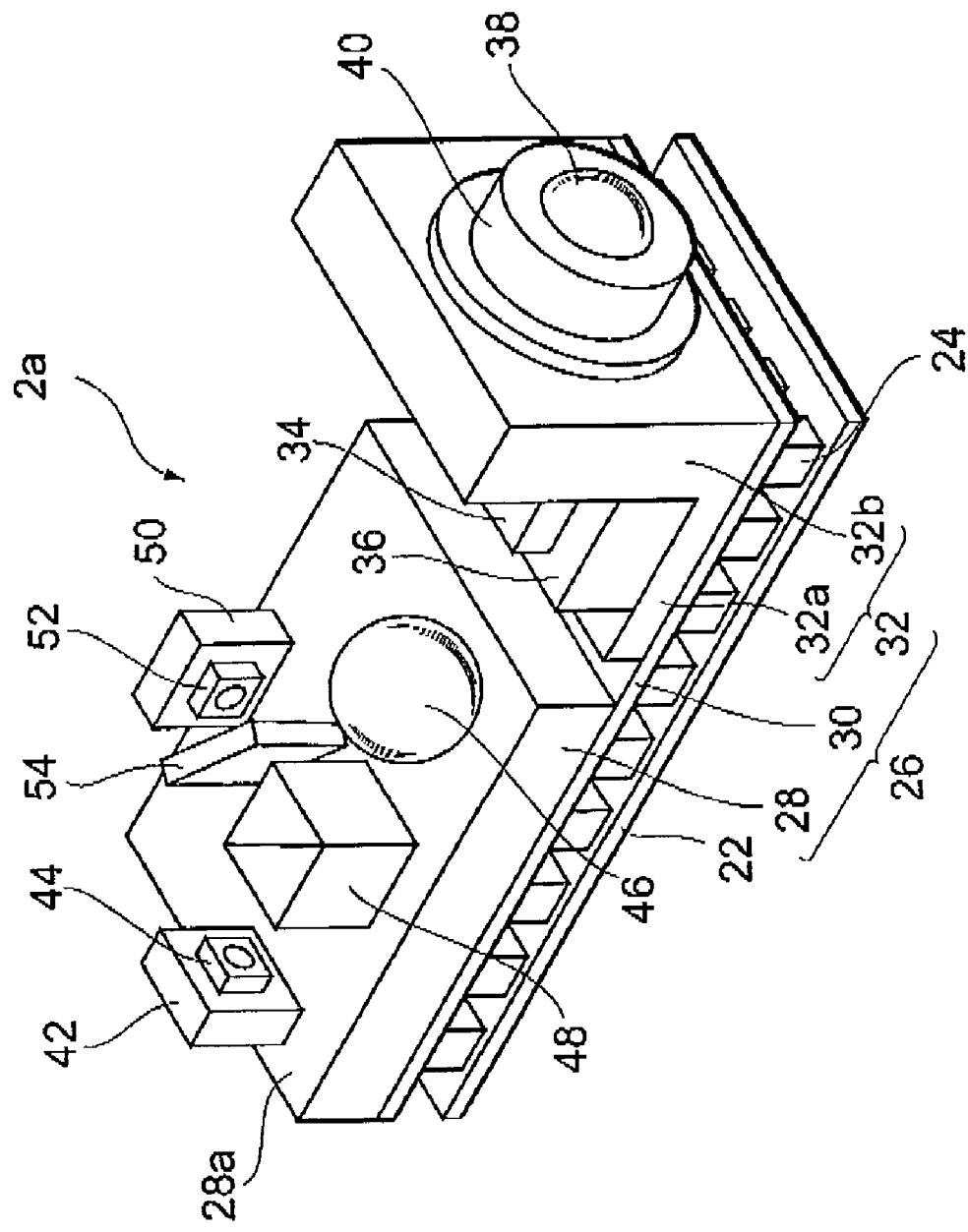
FIG. 2 is a perspective view illustrating a main part of the laser module of the first embodiment.

Referring to FIG. 2, the main part 2a will now be described in detail. FIG. 2 is a perspective view illustrating the structure of the main part 2a. The main part 2a can generate multimode laser light with a stabilized wavelength region.

The main part 2a comprises a thermoelectric cooler 24 fixed to a fixing member 22. As described below, the cooler 24 is a means for adjusting the temperature of a multimode semiconductor laser element 34 to modify its oscillation wavelength region. A thermoelectric cooler such as a Peltier element or the like can be used as the cooler 24. The cooler 24 is electrically connected to the lead terminal 4c. The cooler 24 is controlled by an electric signal supplied via the lead terminal 4c. The cooler 24 adjusts the temperature of the laser element 34 in response to the electric signal to modify the oscillation wavelength region of the laser element 34.

A carrying member 26 is disposed on the cooler 24. A variety of components are mounted on the carrying member 26. The carrying member 26 comprises an arrangement member 30 disposed on the cooler 24 and mounting members 28 and 32 disposed on the arrangement member 30.

In this embodiment, the mounting member 32 is an L carrier. The mounting member 32 has an element carrying portion 32a and a lens holding portion 32b. An element mounting member (chip carrier) 36 is placed on the element carrying portion 32a. The element mounting member 36 carries the multimode semiconductor laser element 34. The laser element 34 is, for example, a Fabry-Perot laser element.

Laser element 34 has a light-emitting surface and a light-reflecting surface opposite to each other. The light-emitting surface has a comparatively low reflectivity in the oscillation wavelength region of the laser element 34. The light-reflecting surface has a reflectivity higher than that of the light-reflecting surface in the oscillation wavelength region of the laser element 34. The laser element 34 is electrically connected to the lead terminal 4c. A drive signal for the laser element 34 is supplied to the laser element 34 via the lead terminal 4c.

A lens holding member 40 which holds a lens 38 is fixed to the lens holding part 32b. The lens 38 faces the light-emitting surface of the laser element 34. The lens 38 is disposed so that the light from the light-emitting surface of the laser element 34 can be provided to one end of the optical fiber 8 through the lens 38.

Using the arrangement member 30, mounting member 32, and element mounting member 36 makes it possible to thermally couple the laser element 34 to the thermoelectric cooler 24. Such thermal coupling allows the temperature of the laser element 34 to be controlled by the cooler 24 within a range.

The mounting member 28 is also disposed on the arrangement member 30. A light-receiving element 44, such as a semiconductor light-receiving element, for detecting the multimode laser light from the laser element 34 is carried on the main surface 28a of the mounting member 28. The light-receiving element 44 is fixed to a chip carrier 42 disposed on the main surface 28a. In this embodiment, the light-receiving element 44 is optically coupled with the light-reflecting surface of the laser element 34. The light-receiving element 44 detects light leaking from the light-reflecting surface. The light-receiving element 44 is electrically connected to the lead terminal 4c. The light-receiving element 44 generates an output electric signal indicating the power of the output light of the laser element 34. This output signal can be transmitted to the outside via the lead terminal 4c.

A lens 46 and a light splitting device 48, such as an optical beam splitter, are disposed between the laser element 34 and the light-receiving element 44. The lens 46 and beam splitter 48 are fixed on the main surface 28a of the mounting member 28. The light-receiving element 44 receives one of the light beams split by the beam splitter 48. The other split beam is provided to a light-receiving element 52 optically coupled with the beam splitter 48.

The light-receiving element 52 is fixed to a chip carrier 50 disposed on the main surface 28a. In this embodiment, the light-receiving element 52 is optically coupled with the light-reflecting surface of the laser element 34. The light-receiving element 52 detects the light leaking from the light-reflecting surface. The light-receiving element 52 is electrically connected to the is lead terminal 4c. An optical filter 54 is disposed between the beam splitter 48 and light-receiving element 52. The optical filter 54 is fixed on the main surface 28a. The light-receiving element 52 detects light going out from the light-reflecting surface of the laser element 34 and passing through the filter 54. The light-receiving element 52 generates an output electric signal, reflecting change in the oscillation wavelength region of the laser element 34. This output signal can be transmitted to the outside via the lead terminal 4c. The output signal can be characterized by an optical characteristic of the filter 54, that is, a reflection characteristic and/or transmission characteristic.

The light-emitting surface of the laser element 34 provides the output light, arid the light-reflecting surface provides the monitor light. Both of the output light and monitor light are multimode laser light. The monitor light is used in both the power monitoring and the wavelength monitoring of the laser light.

The single main surface 28a is an optical positioning standard for the optical components 44, 46, 48, 52 and 54. The mounting member 28 is thermally coupled with the cooler 24 separately from the mounting member 32 which carries the laser element 34. Such thermal coupling makes it possible to control the temperatures of the optical components 44, 46, 48, 52 and 54 to be substantially the same.

Figure 3:
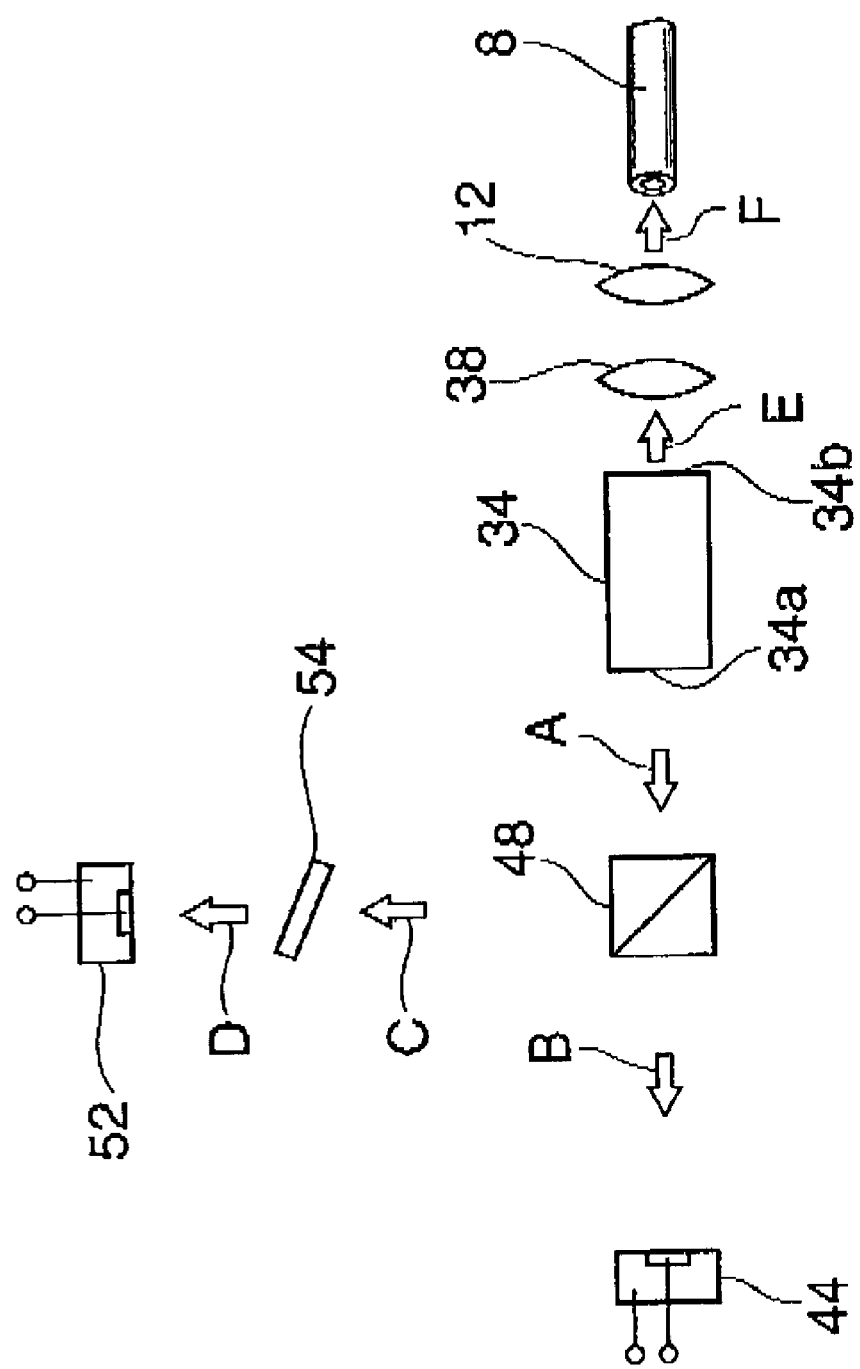
FIG. 3 is a schematic view illustrating the arrangement of the components in the laser module of the first embodiment.

FIG. 3 is a schematic view illustrating the arrangement of the components in the LD module 1a. As shown in FIG. 3, multimode laser light A enters the beam splitter 48 from the light-reflecting surface 34a of the laser element 34. The beam splitter 48 generates split beams B and C. The split beam B enters the light-receiving element 44 for power monitoring. The split beam C enters the optical filter 54. When the split beam C passes through the filter 54, a transmitted beam D is generated. The transmitted beam D enters the light-receiving element 52 for wavelength monitoring. On the other hand, a multimode laser beam a E goes out from the light-emitting surface 34b of the laser element 34 and passes through the lenses 38 and 12 into a laser bean F. The laser beam F enters one end of the optical waveguide 8. The beam incident on the waveguide 8 becomes output light of the LD module 1a.

During the operation of the LD module 1a, an external control circuit (not shown in FIGS. 1–3) is connected to the lead terminal 4c. The control circuit is electrically connected to the light-receiving elements 52 and cooler 24 via the lead terminals 4c. The control circuit receives the output signal of the light-receiving element 52 via the lead terminal 4c. Also, the control circuit supplies the drive signal to the cooler 24 via the lead terminal 4c and controls the operation of the cooler 24. As described below, the control circuit adjusts the temperature of the cooler 24 in response to the output signal of the light-receiving element 52 to modify the oscillation wavelength region of the laser element 34.

Figure 4A:
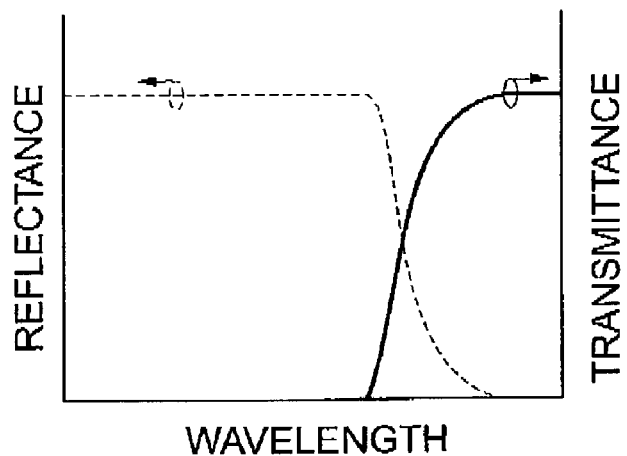
FIGS. 4A–4C illustrate characteristics of a long-wavelength-pass filter, band-pass filter, and short-wavelength-pass filter.
Figure 4B:
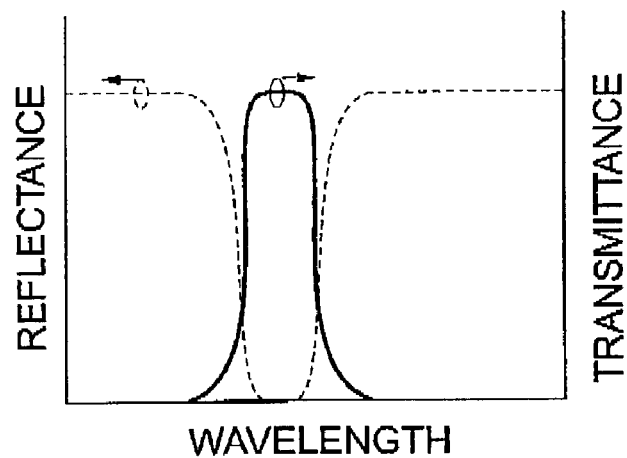
Figure 4C:
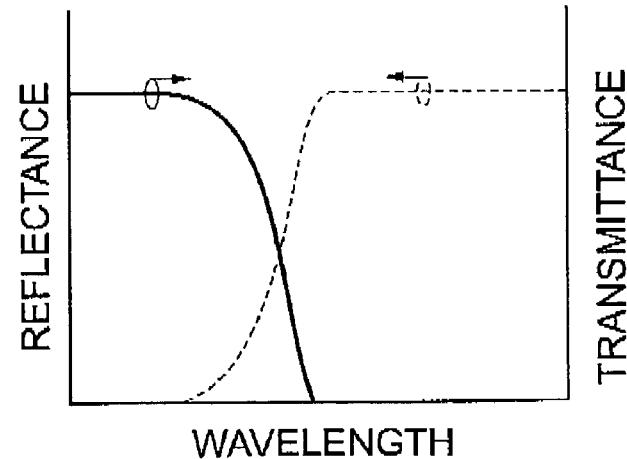

The optical filter 54 may be a long-wavelength-pass filter, a short-wavelength-pass filter or a band-pass filter. FIGS. 4A–4C show transmission characteristics and blocking characteristics of a long-wavelength-pass filter, short-wavelength-pass filter and band-pass filter, respectively. Solid lines in the figures show the transmission wavelength regions, and dotted lines show the reflection wavelength regions. Any of these transmission regions and reflection regions maybe applied to the LD module 1a of this embodiment. The shapes of the transmission regions and reflection regions may be realized in dielectric multilayer film filters.

Figure 5A:
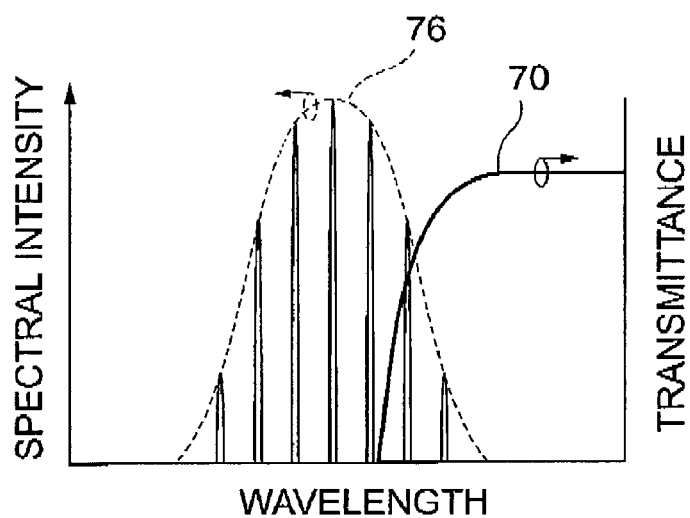
FIGS. 5A–5C illustrate the relationship between the transmission wavelength regions shown in FIGS. 4A–4C and a multimode spectrum.
Figure 5B:
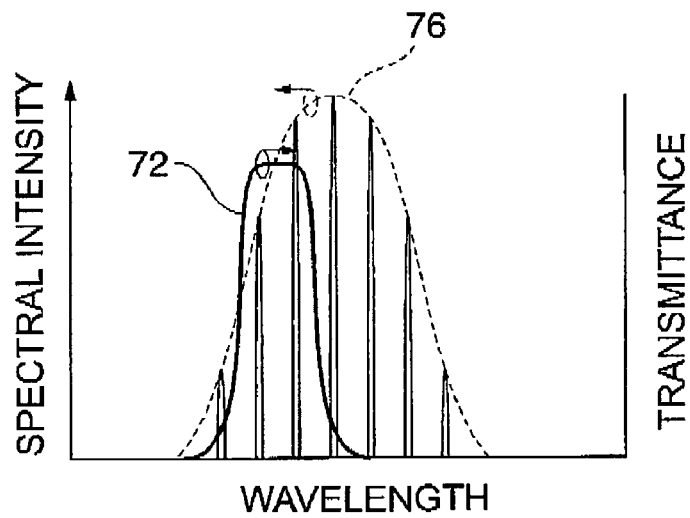
Figure 5C:
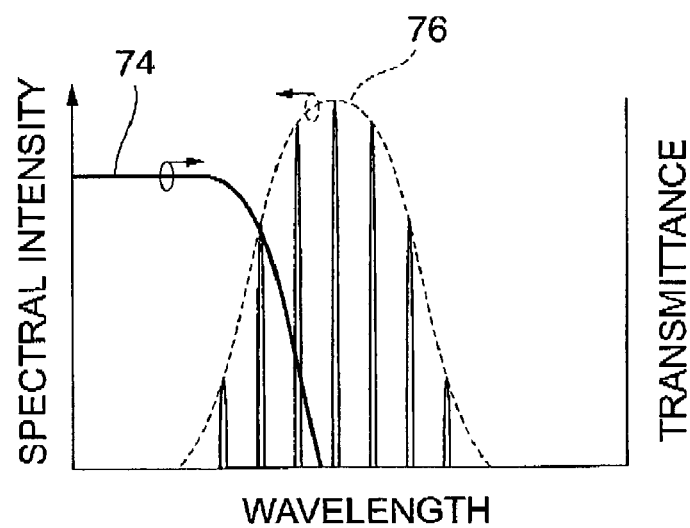

In this embodiment, the light-receiving element 52 for the wavelength monitoring receives the transmitted light from the filter 54. Therefore, the transmission region of the filter 54 affects the output of the light-receiving element 52. FIGS. 5A–5C illustrate the relationships between the transmission regions 70, 72, 74 shown in FIGS. 4A–4C and the multimode spectrum of the light generated by the laser element 34. As shown in FIGS. 5A–5C, the transmission regions 70, 72 and 74 overlap with the multimode spectrum 76. It is preferred that the transmission regions 70 and 74 of the long-wavelength-pass filter and short-wavelength-pass filter are determined so as to contain at least one of the modes in the multimode spectrum. The transmission region of the band-pass filter preferably has a width greater than the spacing between the modes in the multimode spectrum. In any case, the transmission region or the filter 54 preferably has a width sufficient to contain two or more modes of the multimode light generated by the laser element 34.

Figure 6A:
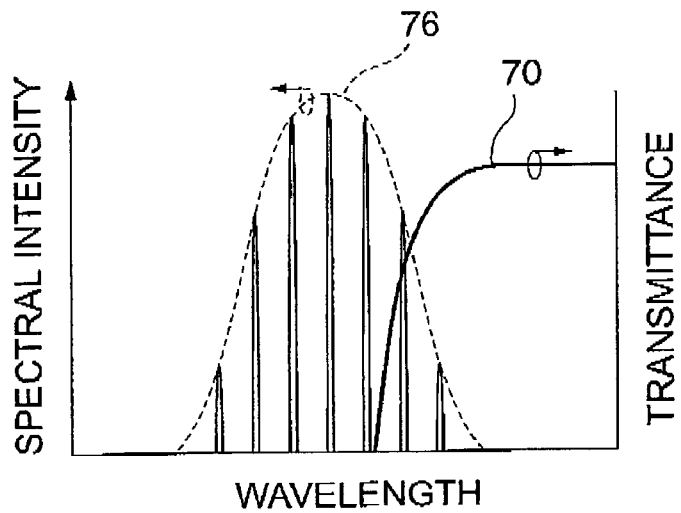
FIG. 6A illustrates the transmission wavelength region of the optical filter and the spectrum of a multimode laser element oscillating at a desired central wavelength.
Figure 6B:
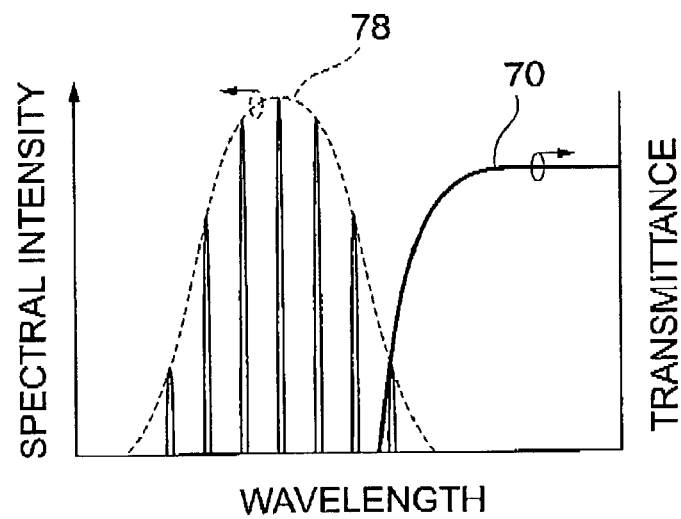
FIG. 6B illustrates the transmission wavelength region of the optical filter and the spectrum of a multimode laser element oscillating at a central wavelength below the desired central wavelength.
Figure 6C:
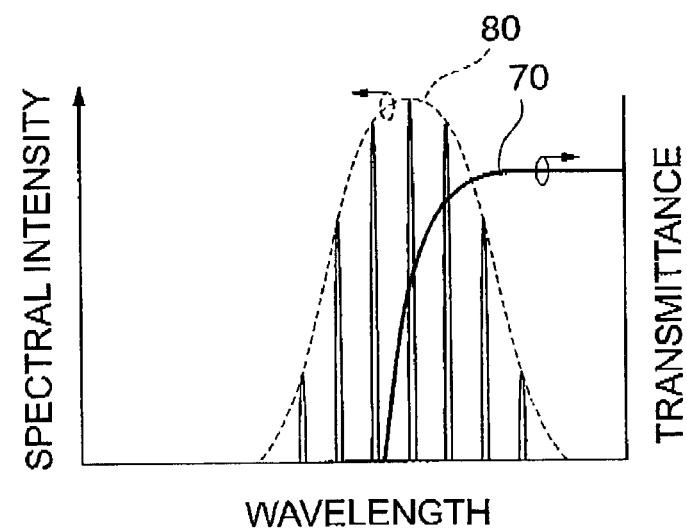
FIG. 6C illustrates the transmission wavelength region of the optical filter and the spectrum of a multimode laser element oscillating at a central wavelength above the desired central wavelength.

FIG. 6A shows the transmission region 70 of the filter 54 and the spectrum 76 of the multimode laser element 34 when oscillating at the desired central wavelength. FIG. 6B shows the transmission region 70 of the filter 54 and a spectrum 78 of the multimode laser element 34 when oscillating at a central wavelength below the desired central wavelength. FIG. 6C shows the transmission region 70 of the filter 54 and a spectrum 80 of the multimode laser element 34 when oscillating at a central wavelength above the desired central wavelength. In this example, the filter 54 is a long-wavelength-pass filter.

In FIGS. 6A–6C, the overlapping areas between the multimode spectra and the transmission region 70 differ from one another. The output electric current of the light-receiving element 52 reflects the difference between the overlapping areas. The output current increases as the overlapping area becomes larger. Conversely, the output current decreases as the overlapping area becomes smaller.

The output current of the light-receiving element 52 corresponding to the degree of overlap shown in FIG. 6B is lower than that corresponding to the degree of overlap shown in FIG 6A. The output current is supplied to an external control circuit (not shown in FIGS. 1–3) connected to the light-receiving element 52 via the lead terminal 4c. The control circuit adjusts the temperature of the cooler 24 in response to the lower output current so as to increase the wavelengths of the light generated by the laser element 34. Since the laser element 34 is thermally coupled with the cooler 24, the temperature of the laser element 34 changes according to the temperature of the cooler 24. As a result, the oscillation spectrum of the laser element 34 shifts to a longer wavelength region.

The output current of the light-receiving element 52 corresponding to the degree of overlap shown in FIG. 6C is higher than that corresponding to the degree of overlap shown in FIG. 6A. The output current is supplied to the above-mentioned control circuit via the lead terminal 4c. The control circuit adjusts the temperature of cooler 24 in response to the higher output current so as to decrease the wavelengths of the light generated by the laser element 34. The temperature of the laser element 34 is changed by this adjustment. As a result, the oscillation spectrum of the laser element 34 shifts to a shorter wavelength region.

Thus, on the basis of a wide oscillation spectrum of a multimode laser element, change in the oscillation wavelength region of the multimode laser element 34 can be detected by measuring the degree of overlap between the oscillation spectrum of the laser element 34 and the transmission wavelength region of the filter 54. The degree of overlap is measured by the light-receiving element 52. The oscillation wavelength region of the laser element 34 is feedback-controlled according to the output of the light-receiving element 52 so that the laser element 34 oscillates at the desired central wavelength. As a result, the LD module 1a can output multimode light with a stable wavelength region.

Second Embodiment

The second embodiment of the LD module in accordance with the present invention will now be described. The arrangement of the components in this embodiment is different from that in the first embodiment. In this embodiment, a light-receiving element for wavelength monitoring is disposed so as to receive light reflected by an optical filter. The other structural features are identical to those of the first embodiment.

FIG. 7 is a schematic view illustrating the arrangement of the components in the LD module of this embodiment. As shown in FIG. 7, the light-emitting element 52 receives reflected light G from the optical filter 54. Therefore, the output electric signal of the light-receiving element 52 is affected by the reflection characteristic of the filter 54. In other words, the reflection wavelength region of the filter 54 affects the output of the light-receiving element 52.

Regardless of whether the optical filter 54 is a long-wavelength-pass filer, a short-wavelength-pass filter or a band-pass filter, the reflection region of the filter 54 overlaps with the multimode spectrum 76. It is preferred that the reflection regions of the long-wavelength-pass filter and short-wavelength-pass filter are determined so as to contain at least one of the modes in the multimode spectrum. The reflection region of the band-pass filter preferably has a width greater than the spacing between the modes in the multimode spectrum. In any case, the reflection region of the filter 54 preferably has a width sufficient to contain two or more modes of the multimode light generated by the laser element 34.

The output of the light-receiving element 52 changes according to the degree of overlap between the reflection wavelength region of the filter 54 and the spectrum of the multimode light from the laser element 34. As in the first embodiment, an external control circuit feedback-controls the oscillation wavelength region of the laser element 34 according to the output of the light-receiving element 52 so that the laser element 34 oscillates at the desired central wavelength. As a result, the LD module of this embodiment can output multimode light with a stable wavelength region as in the first embodiment.

Third Embodiment

Figure 8:
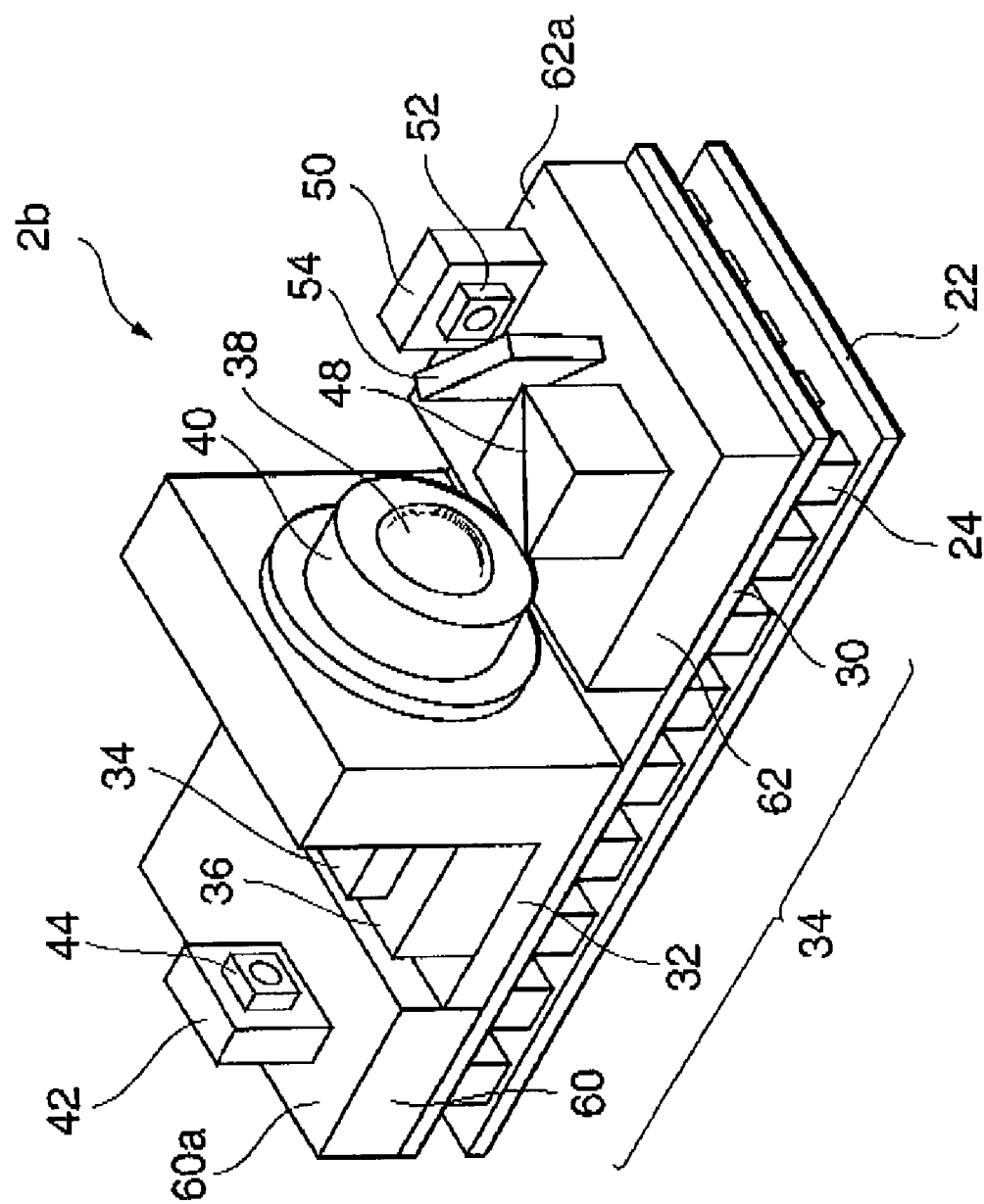
FIG. 8 is a perspective view illustrating a main part of a laser module in accordance with a third embodiment.

Referring to FIG. 8, the third embodiment of the LD module in accordance with the present invention will now be described. FIG. 8 is a perspective view illustrating another example of the main part of the LD module 1a. The LD module of this embodiment comprises a main part 2b shown in FIG. 8 instead of the main part 2a of the LD module 1a of the first embodiment. The other structural features are identical to those of the LD module 1a.

In the main part 2b, mounting members 60, 32 and 62 are arranged on the arrangement member 30 in the order of the description along an axis. The chip carrier 42 is disposed on the main surface 60a of the mounting member 60 to fix a light-receiving element 74 for power monitoring. The light-receiving element 44 faces the light-reflecting surface of the semiconductor laser element 34. Therefore, the light-receiving element 44 is optically coupled with the light-reflecting surface of the laser element 34 directly without interposing any optical component between them.

The lens holding member 40 is disposed on the lens holding part 32b of the mounting member 32. The lens holding member 40 positions the lens 38. The lens 38 is optically coupled with the light-emitting surface of the laser element 34.

The optical beam splitter 48 is arranged on the main surface 62a of the mounting member 62 to be optically coupled with the lens 38. The beam splitter 48 is also optically coupled with the optical fiber 8 via the lens 12. The fiber 8 receives one of the light beams split by the beam splitter 48. The other split beam is supplied to the light-receiving element 52 optically coupled with the beam a splitter 48.

The light-receiving element 52 is fixed to the chip carrier 50 disposed on main surface 62a. In this embodiment, the light-receiving element 52 is optically coupled with the light-emitting surface of the laser element 34. The light-receiving element 52 detects the light emitted from the light-emitting surface. The light-receiving element 52 is electrically connected to the lead terminal 4c. The optical filter 54 is disposed between the beam splitter 48 and the light-receiving element 52. The filter 54 is fixed on the main surface 62a. The light-receiving element 52 detects light going out from the light-emitting surface of the laser element 34 and passing through the filter 54. The light-receiving element 52 generates an output electric signal, reflecting change in the oscillation wavelength region of the laser element 34. This output signal can be transmitted to the outside via the lead terminal 4c. The output signal, can be characterized by an optical characteristic of the filter 54, that is, a reflection characteristic and/or transmission characteristic.

The Single main surface 62a is an optical positioning standard for the optical components 48, 52 and 54. The mounting member 62 is thermally coupled with the cooler 24 separately from the mounting member 32 which carries the laser element 34. Such thermal coupling makes it possible to control the temperatures of the optical components 48, 52 and 54 to be substantially the same. The mounting member 60 is also thermally coupled with the cooler 24 separately from the mounting member 32.

FIG. 9 is a schematic view illustrating the arrangement of the components in the LD module of this embodiment. As shown in FIG. 9, multimode laser light H enters the light-receiving element 44 for power monitoring from the light reflecting surface 34a of the laser element 34. Multimode laser light I passes through the lens 38 from the light-emitting surface 34b of the laser element 34 to become light J. The light J enters the beam splitter 48. The beam splitter 48 generates split beams K and L. The split beam K passes through the lens 12 to become a beam N. The beam N enters one end of the optical waveguide 8. The beam incident on the waveguide 8 becomes output light of the LD module. The split beam L enters the optical filter 54. When the split beam L passes through the filter 54, a transmitted beam M is generated. The transmitted beam M enters the light-receiving element 52 for wavelength monitoring.

As in the first embodiment, the output of the light-receiving element 52 changes according to the degree of overlap between the transmission wavelength region of the filter 54 and the spectrum of the multimode light from the laser element 34. An external control circuit feedback-controls the oscillation wavelength region of the laser element 34 according to the output of the light-receiving element 52 so that the laser element 34 oscillates at the desired central wavelength. As a result, the LD module of this embodiment can output multimode light with a stable wavelength region, as in the first embodiment.

Fourth Embodiment

The fourth embodiment of the LD module in accordance with the present invention will now be described. The arrangement of the components in this embodiment is different from that in the third embodiment. In this embodiment, a light-receiving element for wavelength monitoring is disposed so as to receive light reflected by an optical filter. The other structural features are identical to those of the third embodiment.

FIG. 10 is a schematic view illustrating the arrangement of the components in the LD module of this embodiment. As shown in FIG. 10, the light-receiving element 52 receives reflected light P from the optical filter 54. Therefore, the output electric signal of the light-receiving element 52 is affected by the reflection characteristic of the filter 54. In other words, the reflection wavelength region of the filter 54 affects the output of the light-receiving element 52.

The output of the light-receiving element 52 changes according to the degree of overlap between the reflection wavelength region of the filter 54 and the spectrum of the multimode light from laser element 34. As in the first embodiment, an external control circuit feedback-controls the oscillation wavelength region of the laser element 34 according to the output of the light-receiving element 52 so that the laser element 34 oscillates at the desired central wavelength. As a result, the LD module of this embodiment can output multimode light with a stable wavelength region, as in the first embodiment.

Fifth Embodiment

The fifth embodiment of the LD module in accordance with the present invention will now be described. In the above-described embodiments, the component for detecting the change of the oscillation wavelength region of the laser element 34 is contained in the housing 4. By contrast, in this embodiment, a unit for detecting the change of the oscillation wavelength region of the laser element 34 is externally attached to the housing 4.

FIG. 11 is a partially cutaway perspective view illustrating the structure of LD module 1c of this embodiment. The LD module 1c comprises a main part 2c, a housing 4, an optical coupling part 6, an optical fiber 8, and a wavelength detector 90. The housing 4, optical coupling part 6 and optical fiber 8 are identical to those described above.

The main part 2c comprises a multimode semiconductor laser element 34, a light-receiving element 44 for monitoring, and a thermoelectric cooler 24. As will be described below, the cooler 24 is used to modify the oscillation wavelength region of the laser element 34 in response to an output electric signal of the wavelength detector 90. The main part 2c is optically coupled with the wavelength detector 90 via the optical coupling part 6 and the fiber 8. The multimode light emitted from the light-emitting surface of the laser element 34 propagates in the fiber 8 and enters the wavelength detector 90. The wavelength detector 90 is optically coupled with an optical fiber 9 for providing output light to the outside.

Figure 12:
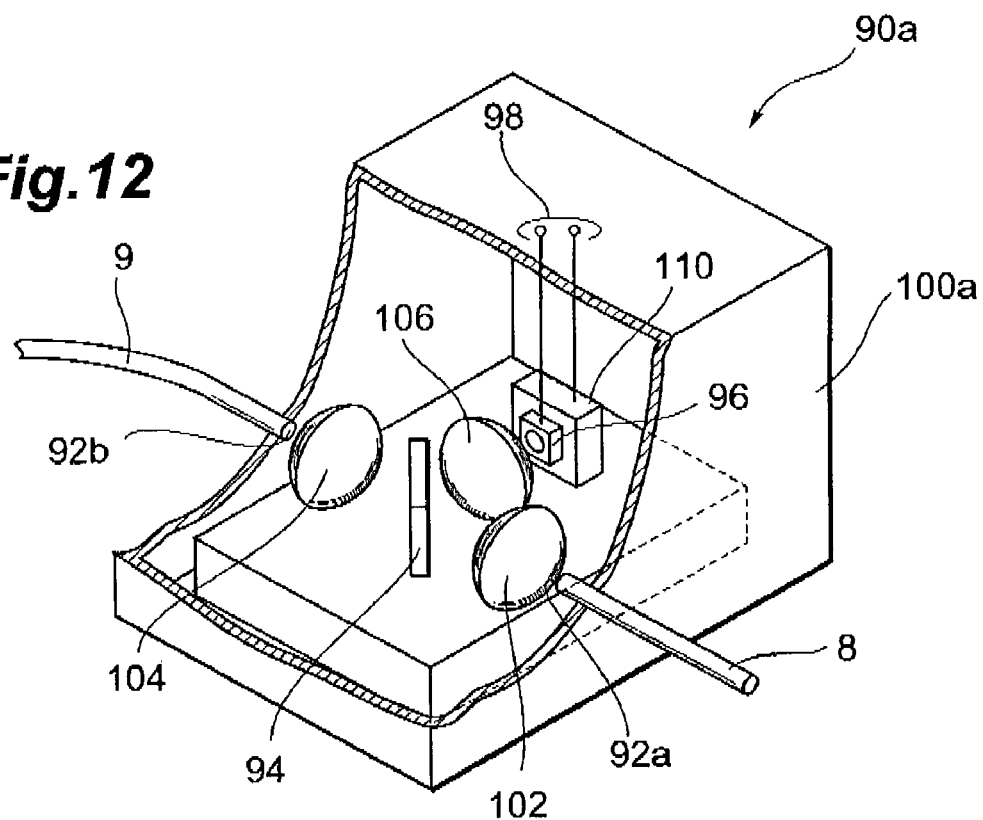
FIG. 12 is a partially cutaway perspective view illustrating the structure of a wavelength detector in accordance with the fifth embodiment.

FIG. 12 is a partially cutaway perspective view illustrating the structure of one embodiment 90a of the wavelength detector 90. The wavelength detector 90a comprises a light input port 92a, a light output port 92b, an optical filter 91, a light-receiving element 96 for wavelength monitoring, an output terminal 98, and a housing 100a. The optical filter 94 and light-receiving element 96 are identical to the optical filter 54 and light-receiving element 52 in the above-described embodiments. A lens 102 is disposed between the light input port 92a and the filter 94. A lens 104 is disposed between the light output port 92b and the filter 94. The lens 102, filter 94, and lens 104 are arranged in a line. A lens 106 is disposed between the filter 94 and the light-receiving element 96. The filter 94, lens 106 and light-receiving element 96 are arranged in a line. The housing 100a accommodates a wavelength detection device composed of the filter 94, light-receiving element 96, output terminal 98, and lenses 102, 104 and 106. The light-receiving element 96 is fixed to a mounting member 110 such as a chip carrier or the like. An output electric signal of the light-receiving element 96 is sent to the output terminal 98. In the wavelength detector 90a, reflected light from the filter 94 enters the light-receiving element 96 for wavelength monitoring.

The spectra of the filter 94 may be those shown in FIGS. 4A–4C. As described above, both the transmission region and the reflection region overlap with the spectrum of the multimode light generated by the laser element 34. The transmission region and reflection region have a width sufficient to contain two or more modes of the multimode light.

Figure 13:
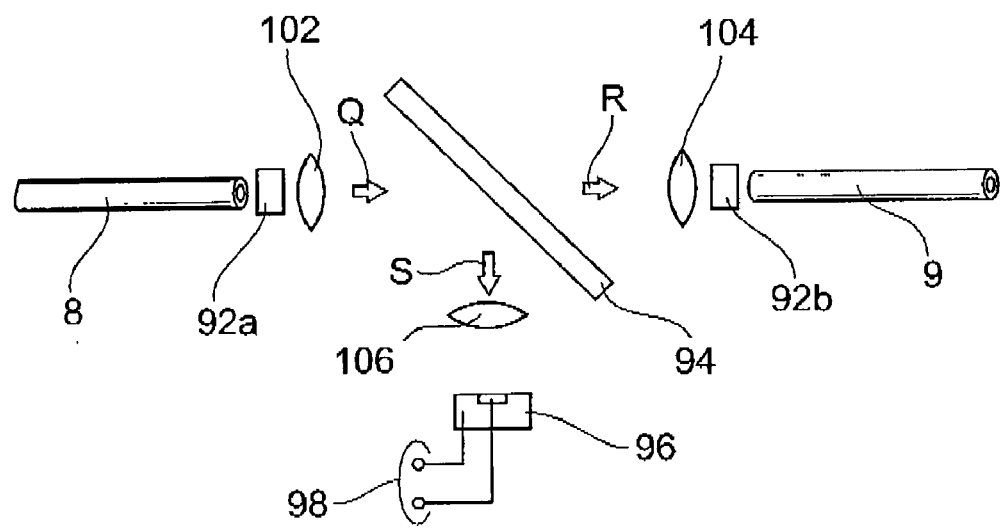
FIG. 13 is a schematic view illustrating the arrangement of the components in the wavelength detector of the fifth embodiment.

FIG. 13 is a schematic view illustrating the arrangement of the components in the wavelength detector 90a. As shown in FIG. 13, light Q enters the optical filter 94 from the optical fiber 8 via the input port 92a and lens 102. As a result, transmitted light R and reflected light S are generated. The reflected light S enters the light-receiving element 96 for wavelength monitoring through the lens 106. The transmitted light R enters the optical fiber 9 through the lens 104 and output port 92b. The light incident on the fiber 9 becomes output light of the LD module 1c. In this embodiment, the light-receiving element 96 receives the reflected light S from the filter 94.

Based on the principle identical to that of the above-described embodiments, the wavelength detector 90a can detect change in the oscillation wavelength region of the laser element 34. In this embodiment, the output of the light-receiving element 96 indicates the degree of overlap between the reflection wavelength region of the filter 94 and the spectrum of the multimode light generated by the laser element 34. Therefore, the change in the oscillation wavelength region of the laser element 34 can be detected based on the output of the light-receiving element 96.

As in the above embodiments, an external control circuit may be connected to the light-receiving element 96 and cooler 24 to control the oscillation wavelength region of the laser element 34 in response to the output of the light-receiving element 96. This will be described in greater detail in the seventh embodiment.

Sixth Embodiment

The sixth embodiment of the LD module in accordance with the present invention will now be described. In this embodiment, the structure of the wavelength detector 90 is different from that in the fifth embodiment. The structures of the other components are identical to those in the fifth embodiment.

Figure 14:
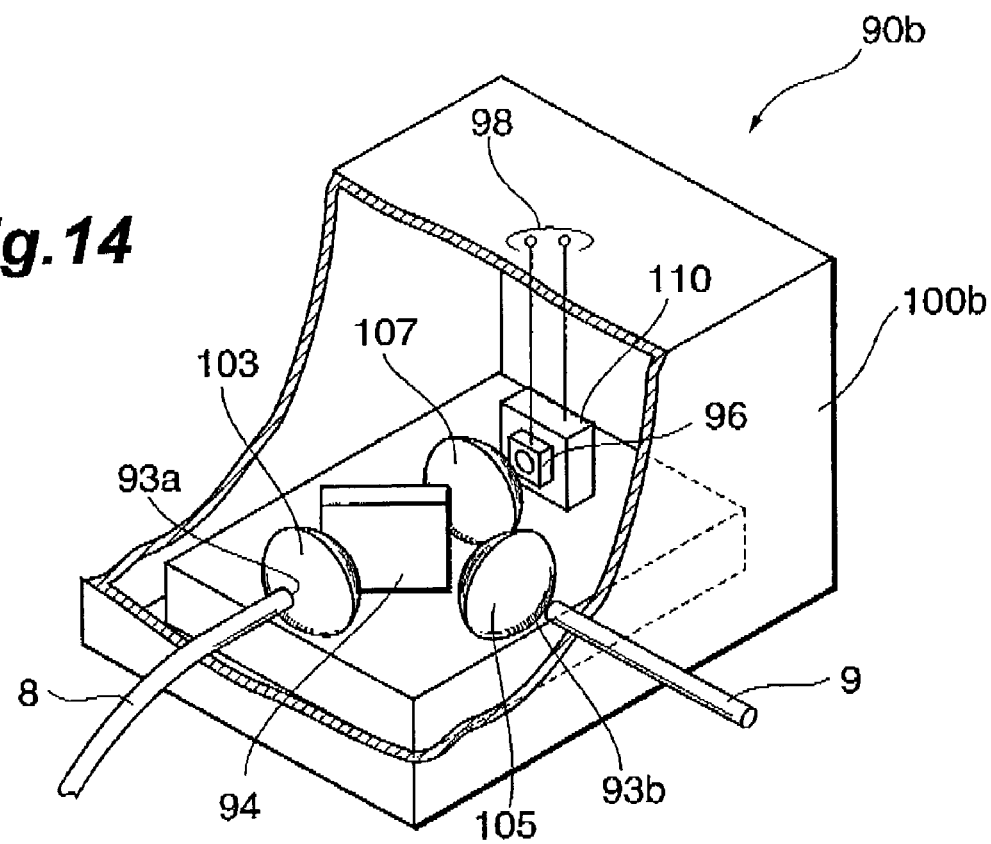
FIG. 14 is a partially cutaway perspective view illustrating the structure of a wavelength detector in accordance with a sixth embodiment.

FIG. 14 is a partially cutaway perspective view illustrating the structure of a wavelength detector 90b used in this embodiment. The wavelength detector 90b comprises a light input port 93a, a light output port 93b, an optical filter 94, a light-receiving element 96, an output terminal 98, and a housing 100b. A lens 103 is disposed between the light input port 93a and the filter 94. A lens 107 is disposed between the filter 94 and the light-receiving element 96. The lens 103, filter 94, lens 107 and light-receiving element 96 are arranged in a line. A lens 105 is disposed between the light output port 93b and the filter 94. The housing 100b accommodates the wavelength detection device composed of the filter 94, light-receiving element 96, output terminal 98, and lenses 103, 105 and 107. In the wavelength detector 90b, transmitted light from the filter 94 enters the light-receiving element 96 for wavelength monitoring.

Figure 15:
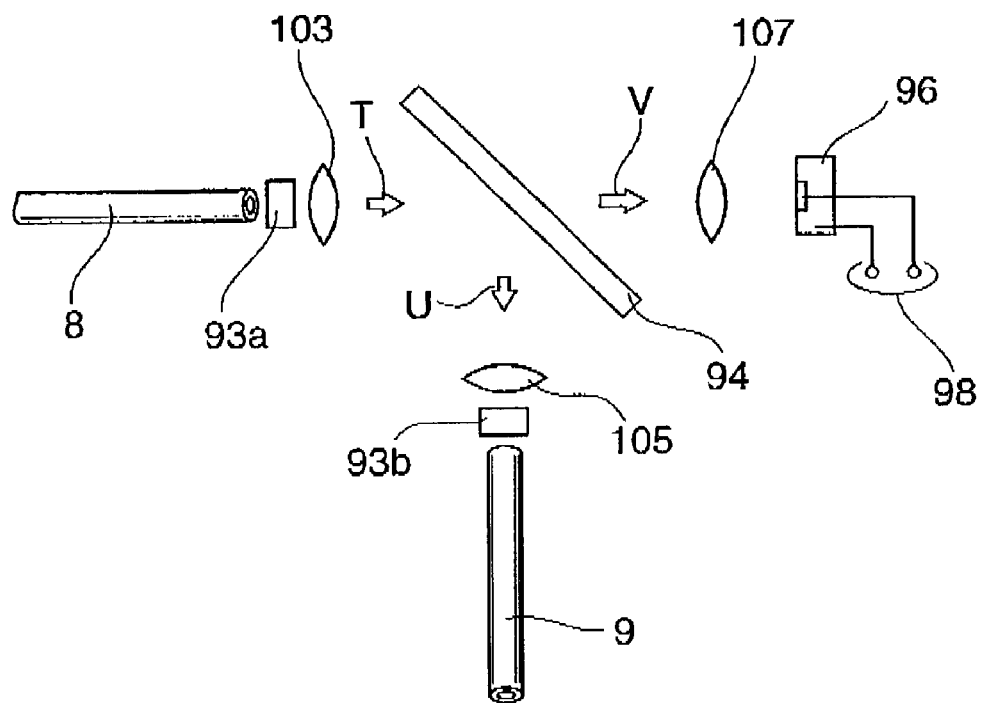
FIG. 15 is a schematic view illustrating the arrangement of the components in the wavelength detector of the sixth embodiment.

FIG. 15 is a schematic view illustrating the arrangement of the components in the wavelength detector 90b. As shown in FIG. 15, light T enters the optical filter 94 from the optical fiber 8 via the input port 93a and lens 103. As a result, transmitted light V and reflected light U are generated. The transmitted light V enters the light-receiving element 96 for wavelength monitoring through the lens 107. The reflected light U enters the optical fiber 9 through the lens 105 and output port 93b. The light incident on the fiber 9 becomes output light of the LD module of this embodiment. In the wavelength detector 90b, the light-receiving element 96 receives the transmitted light V from the filter 94.

As in the fifth embodiment, the wavelength detector 90b can detect change in the oscillation wavelength region of the laser element 34, The output of the light-receiving element 96 shows the degree of overlap between the spectrum of the multimode light generated by the laser element 34 and the transmission wavelength region of the filter 94. Therefore, the change in the oscillation wavelength region of the laser element 34 can be detected based on the output of the light-receiving element 96.

As in the fifth embodiment, an external control circuit maybe connected to the light-receiving element 96 and cooler 24 to control the oscillation wavelength region of the laser element 34 in response to the output of the light-receiving element 96.

Seventh Embodiment

Figure 16:
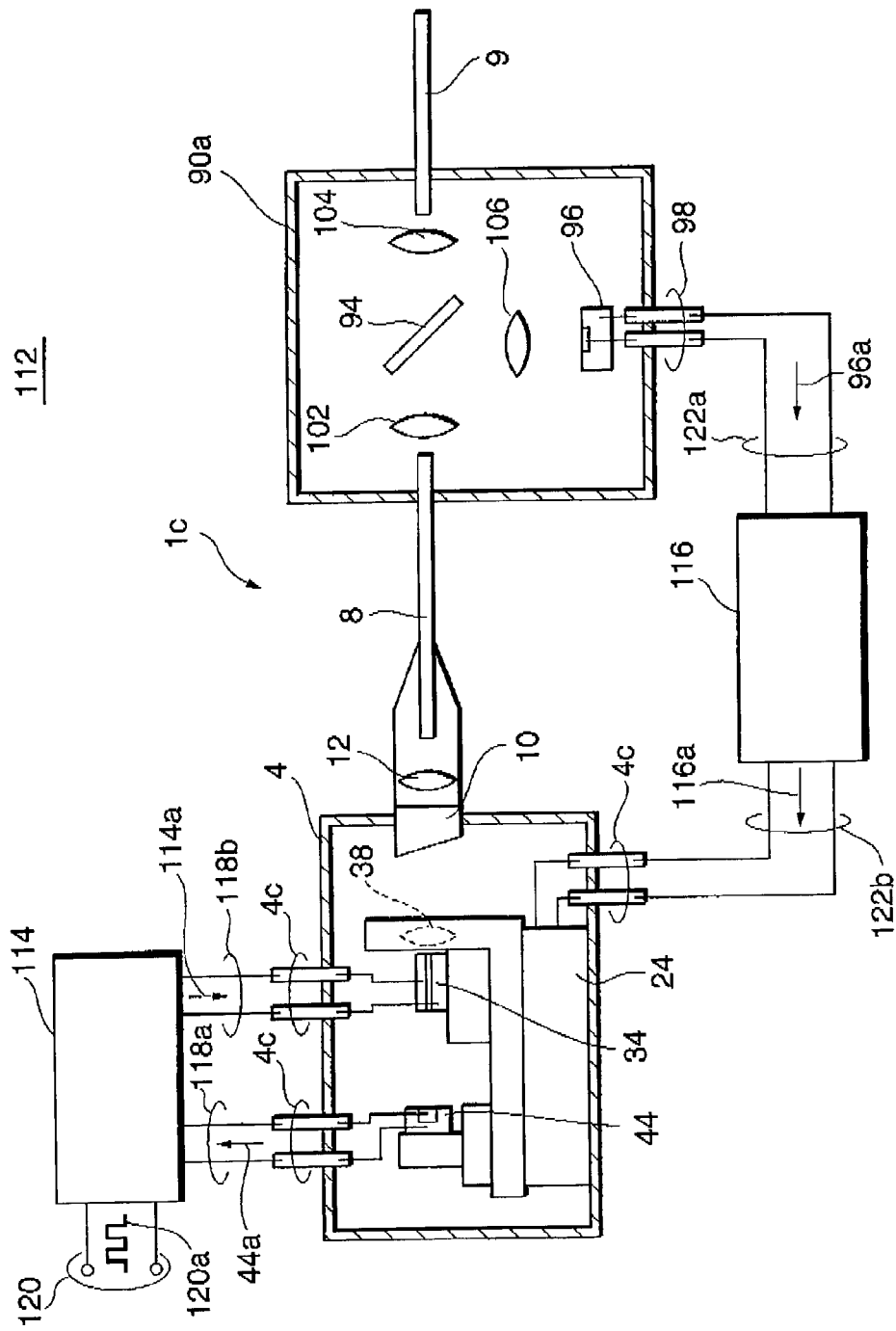
FIG. 16 is a schematic view illustrating a wavelength stabilizer in accordance with a seventh embodiment.

An embodiment of the wavelength stabilizer in accordance with the present invention will now be described. FIG. 16 is a schematic view illustrating the structure of a wavelength stabilizer 112 of this embodiment. The wavelength stabilizer 112 comprises the multimode LD module 1c of the fifth embodiment, a power control circuit 114, and a wavelength control circuit 116. The power control circuit 114 is electrically connected to the LD module 1c via the lead terminal 4c. The wavelength control circuit 116 is electrically connected to the LD module 1c via the load terminal 4c and the output terminal 98 of the wavelength detector 90a.

The power control circuit 114 receives a modulation signal 120a from an external circuit via an input terminal 120. Also, the power control circuit 114 receives an output signal 44a from the light-receiving element 44 for power monitoring in the LD module 1c via the lead terminal 4c and a signal line 118a. The power control circuit 114 generates a drive signal 114a, which is controlled so as to bring the light power close to a predetermined value, in response to the signals 120 and 44a. The drive signal 114a is supplied to the laser element 34 located inside the LD module 1c via a signal line 118b and the lead terminal 4c. Control of the light power is performed in this way.

The wavelength control circuit 116 receives an output signal 96a of the light-receiving element 96 for wavelength monitoring via the output terminal 98 and a signal line 122a. As described above, the output signal 96a shows the degree of overlap between the output light spectrum of the laser element 34 and the reflection region of the filter 94. The wavelength control circuit 116 generates a control signal 116a in response to the output signal 96a. The signal 116a instructs the cooler 24 to increase or decrease the temperature so that the oscillation wavelength region of the laser element 34 approaches the desired wavelength region. The signal 116a is supplied to the cooler 24 via a signal line 122b and the lead terminal 4c. The cooler 24 changes its temperature in response to the signal 116a. The temperature of the laser element 34 changes accordingly, and therefore the oscillation wavelength region also changes.

Thus, the wavelength control circuit 116 feedback-controls the oscillation wavelength region of the laser element 34 according to the output of the light-receiving element 94 so that the laser element 34 oscillates at the desired central wavelength. As a result, the wavelength stabilizer 112 can stabilize the wavelengths of the output multimode light of the LD module 1c.

In this embodiment, the LD module 1c is used as a source of multimode light; however, any of the other LD modules described above may be used instead of the LD module 1c.

Eighth Embodiment

Figure 17:
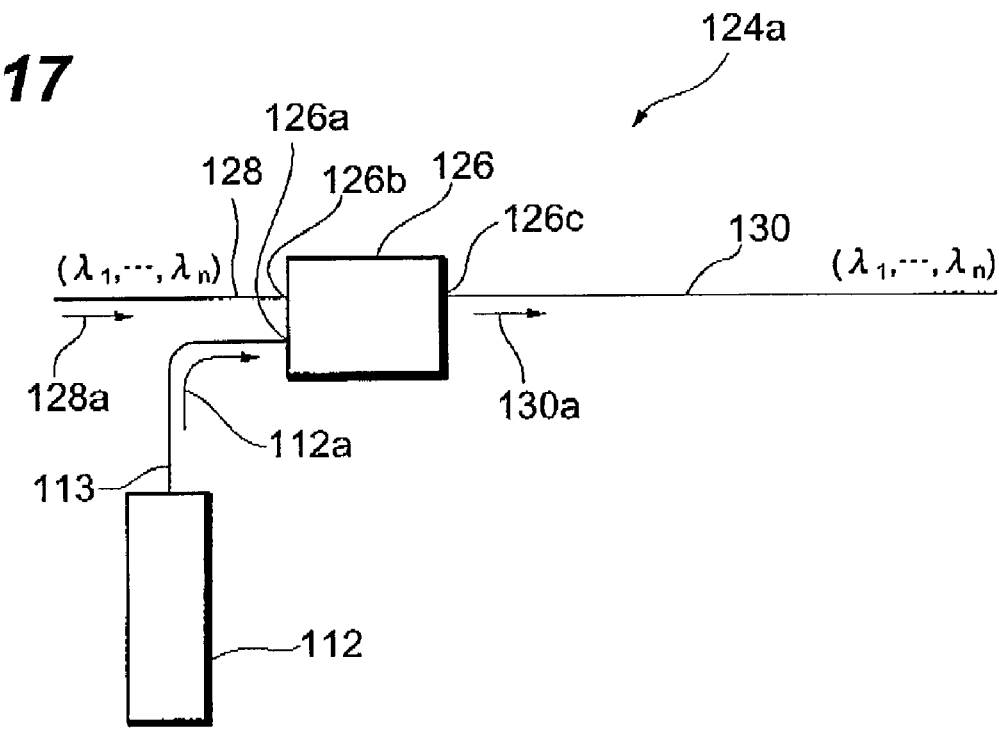
FIG. 17 is a schematic view illustrating the Raman amplifier in accordance with an eighth embodiment.

An embodiment of the Raman amplifier in accordance with the present invention will now be described. FIG. 17 is a schematic vies illustrating the structure of a Raman amplifier 124a of this embodiment. The Raman amplifier 124a comprises the wavelength stabilizer 112 of the seventh embodiment and an optical coupler 126.

The optical coupler 126 is, for example, a WDM coupler. Input ports 126a and 126b of the coupler 126 are optically coupled with an optical transmission path 128 and an excitation light supplying path 113, respectively. A signal light 128a is transmitted through the transmission path 128. The signal light 128a is, for example, a WDM signal including a plurality of wavelength components ($\lambda_1, \ldots \lambda_n$). An output port 126c of the coupler 126 is optically coupled with an optical transmission path 130. The transmission path 130 is, for example, a single-mode optical fiber (SMF). An example of SMF is a dispersion compensated optical fiber (DCF).

The wavelength stabilizer 112 supplies excitation light 112a via the optical fiber 9 to the supplying path 113. The LD module 1c in the wavelength stabilizer 112 emits multimode light as the excitation light 112a, whose wavelengths enable the signal light 128a to be Raman-amplified in the transmission path 130 where the excitation light 112a and signal light 128a coexist. The excitation light 112a is supplied via the supplying path 113 to the coupler 126. The excitation light 112a can Raman-amplify at least one of the wavelength components of the WDM signal.

The signal light 128a and excitation light 112a are sent to the transmission path 130 by the coupler 126. As a result, the WDM signal 128a, which includes the wavelength components ($\lambda_1, \ldots \lambda_n$), and the Raman excitation light 112a, which is able to Raman-amplify at least one of these wavelength components, are provided in the transmission path 130. The excitation light 112a excites the transmission path 130 to Raman-amplify at least one of the wavelength components of the signal light 128a. Since the wavelengths of the excitation light 112a emitted from the device 112 is stabilized, the Raman amplification is performed reliably.

This embodiment relates to a forward-type Raman amplifier; however, the Raman amplifier in accordance with the present invention maybe a backward type amplifier. In the backward-type Raman amplifier, the excitation light is supplied to the signal light input port of the optical coupler. The excitation light is sent to an optical transmission path disposed upstream of the coupler. The signal light is transmitted throught this transmission path to the coupler. When the excitation light is supplied into the transmission path via the coupler, the transmission path is excited. The signal light is Raman-amplified in this way.

Ninth Embodiment

Figure 18:
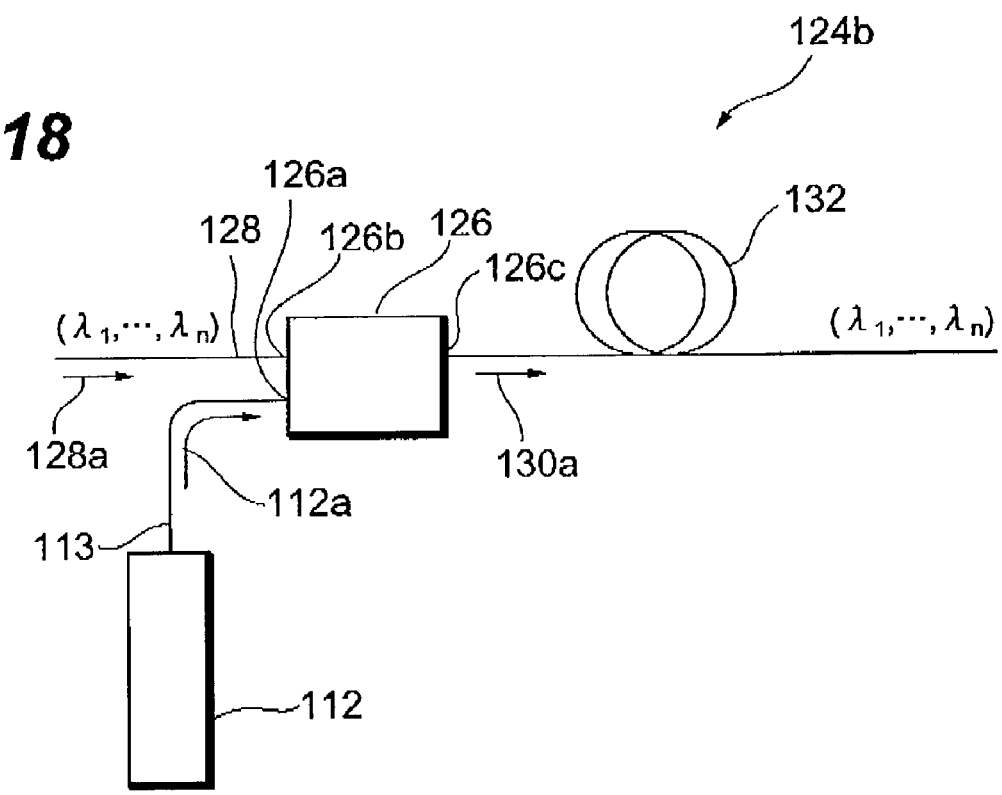
FIG. 18 is a schematic view illustrating the Raman amplifier in accordance with a ninth embodiment.

Another embodiment of the Raman amplifier in accordance with the present invention will now be described. FIG. 18 is a schematic view illustrating the structure of a Raman amplifier 124b of this embodiment. The Raman amplifier 124b comprises the wavelength stabilizer 112 of the seventh embodiment, an optical coupler 126, and an optical fiber 132 for excitation. The operations of the wavelength stabilizer 112 and coupler 126 are identical to those in the eighth embodiment.

The optical fiber 132 for excitation is optically coupled with the output port 126c of the coupler 126. The fiber 132 is, for example, a single-mode optical fiber (SMF).

The signal light 128a and excitation light 112a are sent to the fiber 132 by the coupler 126. As a result, the WDM signal, which includes wavelength components $(\lambda_1, \ldots, \lambda_n)$, and the Raman excitation light, which is able to Raman-amplify at least one of these wavelength components, are provided in the fiber 132. The excitation light 112a excites the fiber 132 to Raman-amplify at least one of the wavelength components of the signal light 128a. Since the wavelengths of the excitation light 112a emitted from the device 112 is stabilized, the Raman amplification is performed reliably.

This embodiment relates to a forward-type Raman amplifier; however, the Raman amplifier in accordance with the present invention may also be a backward-type amplifier. In the backward-type Raman amplifier, the excitation light is supplied to the signal light input port of the optical coupler. The excitation light is sent to an optical fiber for excitation disposed upstream of the coupler. The signal light is transmitted through this fiber to the coupler. When the excitation light is supplied into the fiber via the coupler, the fiber is excited. The signal light is Raman-amplified in this way.

The present invention is not limited to the above-described embodiments arid various modifications can be made. For example, in the above-described embodiments, the optical fiber, light-receiving element, output terminal, and lens are disposed on the main surface of the mounting member in the wavelength detector. However, the arrangement of those components is not limited to such embodiments.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A multimode semiconductor laser module comprising:
   a longitudinal-multimode semiconductor laser element having first and second end surfaces for emitting multimode laser light, said laser element having an oscillation wavelength region including a plurality of longitudinal modes;
   a wavelength selective optical filter optically coupled with said first end surface to receive the multimode laser light emitted from said first end surface, said optical filter having a nonperiodic transmission wavelength region or a nonperiodic reflection wavelength region having a bandwidth sufficient to contain two or more of said longitudinal modes;
   a first light-receiving element for receiving transmitted light or reflected light from said optical filter to generate an output signal corresponding to the power of the received light; and
   wavelength modifying means for modifying the oscillation wavelength region of said laser element in response to the output signal of said first light-receiving element.

2. The laser module according to claim 1, wherein said optical filter produces transmitted light or reflected light with a power which changes according to the oscillation wavelength region of said laser element.

3. The laser module according to claim 1, further comprising:
   a first terminal for supplying the output signal of said first light-receiving element to an external control circuit; and
   a second terminal for supplying a control signal from said external control circuit to said wavelength modifying means,
   wherein said external control circuit generates said control signal in response to the output signal of said first light-receiving element;
   said control signal instructs said wavelength modifying means to modify the oscillation wavelength region of said laser element so that the oscillation wavelength spectrum of said laser element has a desired central wavelength; and
   said wavelength modifying means modifies the oscillation wavelength region of said laser element according to said control signal.

4. The laser module according to claim 1, wherein said wavelength modifying means comprises a temperature regulator for regulating the temperature of said laser element.

5. The laser module according to claim 1, further comprising a housing for accommodating said laser element and said wavelength modifying means.

6. The laser module according to claim 1, further comprising a second light-receiving element optically coupled with the second end surface of said laser element.

7. The laser module according to claim 1, further comprising:
   a light splitting device for receiving the multimode laser light from said first end surface to produce two split beams; and
   a second light-receiving element for receiving one of the split beams from said splitting device,
   wherein said optical filter receives the other split beam from said splitting device.

8. A wavelength detector comprising:
   a light input port for receiving multimode laser light from a longitudinal-multimode semiconductor laser element having an oscillation wavelength region including a plurality of longitudinal modes;
   a wavelength selective optical filter optically coupled with said light input port to receive the multimode laser light from said input port, said optical filter having a nonperiodic transmission wavelength region or a nonperiodic reflection wavelength region having a bandwidth sufficient to contain two or more of said longitudinal modes;
a light receiving element for receiving one of transmitted light and reflected light from said optical filter to generate an output signal corresponding to the power of the received light; and
a light output port for receiving the other of the transmitted light and reflected light from said optical filter.

9. The wavelength detector according to claim 8, wherein said optical filter produces transmitted light or reflected light with a power which changes according to an oscillation wavelength region of said laser element.

10. A multimode semiconductor laser module comprising:
a longitudinal-multimode semiconductor laser element having an oscillation wavelength region including a plurality of longitudinal modes;
a light input port for receiving multimode laser light from said laser element;
a wavelength selective optical filter optically coupled with said light input port to receive the multimode laser light from said light input port, said optical filter having a nonperiodic transmission wavelength region or a nonperiodic reflection wavelength region having a bandwidth sufficient to contain two or more of said longitudinal modes;
a first light-receiving element for receiving one of the transmitted light and reflected light from said optical filter to produce an output signal corresponding to the power of the received light;
a light output port for receiving the other of the transmitted light and reflected light from said optical filter; and
wavelength modifying means for modifying the oscillation wavelength region of said laser element in response to the output signal of said first light-receiving element.

11. The laser module according to claim 10, further comprising:
a first terminal for supplying the output signal of said first light-receiving element to an external control circuit; and
a second terminal for supplying a control signal from said external control circuit to said wavelength modifying means,
wherein said external control circuit generates said control signal in response to the output signal of said first light-receiving element;
said control signal instructs said wavelength modifying means to modify the oscillation wavelength region of said laser element so that the oscillation wavelength spectrum of said laser element has a desired central wavelength; and
said wavelength modifying means modifies the oscillation wavelength region of said laser element according to said control signal.

12. The laser module according to claim 10, wherein said wavelength modifying means comprises a temperature regulator for regulating the temperature of said laser element.

13. The laser module according to claim 10, further comprising a housing for accommodating said laser element and said wavelength modifying means.

14. The laser module according to claim 10, wherein said laser element has first and second end surfaces for emitting the multimode laser light, said laser module further comprising:
an optical fiber for optically coupling said light input port to the first end surface of said laser element; and
a second light-receiving element optically coupled with said second end surface.

15. A wavelength stabilizer comprising:
a laser module according to claim 1; and
a control circuit for generating a control signal in response to the output signal of said first light-receiving element to control said wavelength modifying means;
wherein said wavelength modifying means modifies the oscillation wavelength region of said laser element according to the control signal.

16. A wavelength stabilizer comprising:
a laser module according to claim 10; and
a control circuit for generating a control signal in response to the output signal of said first light-receiving element to control said wavelength modifying means,
wherein said wavelength modifying means modifies the oscillation wavelength region of said laser element according to the control signal.

17. A Raman amplifier comprising:
an optical coupler;
an optical transmission path for transmitting signal light, said optical transmission path being optically coupled with said optical coupler;
a laser module according to claim 1 optically coupled with said optical coupler; and
a control circuit for generating a control signal in response to an output signal of said first light-receiving element to control said wavelength modifying means,
wherein said wavelength modifying means modifies the oscillation wavelength region of said laser element according to the control signal; and
said optical coupler sends multimode light from said laser module to said optical transmission path, thereby exciting said optical transmission path to Raman-amplify said signal light.

18. A Raman amplifier comprising:
an optical coupler;
an optical transmission path for transmitting signal light, said optical transmission path being optically coupled with said optical coupler;
a laser module according to claim 10 optically coupled with said optical coupler; and
a control circuit for generating a control signal in response to an output signal of said first light-receiving element to control said wavelength modifying means,
wherein said wavelength modifying means modifies the oscillation wavelength region of said laser element according to the control signal; and
said optical coupler sends multimode light from said laser module to said optical transmission path, thereby exciting said optical transmission path to Raman-amplify said signal light.

* * * * *